(12) United States Patent
Cahill

(10) Patent No.: US 6,667,549 B2
(45) Date of Patent: Dec. 23, 2003

(54) MICRO CIRCUITS WITH A SCULPTED GROUND PLANE

(75) Inventor: Sean Cahill, Palo Alto, CA (US)

(73) Assignee: Bridgewave Communications, Inc., Santa Clara, CA (US)

(*) Notice: Subject to any disclaimer, the term of this patent is extended or adjusted under 35 U.S.C. 154(b) by 0 days.

(21) Appl. No.: 10/137,002

(22) Filed: May 1, 2002

(65) Prior Publication Data
US 2003/0206261 A1 Nov. 6, 2003

(51) Int. Cl.⁷ .............................. H01L 23/34
(52) U.S. Cl. .................. 257/728; 257/691; 257/660
(58) Field of Search ............... 257/728, 659, 257/660, 624, 690, 691

(56) References Cited

U.S. PATENT DOCUMENTS

| | | | |
|---|---|---|---|
| 4,581,291 A | 4/1986 | Bongianni | 428/381 |
| 4,626,805 A | 12/1986 | Jones | 333/33 |
| 4,673,904 A | 6/1987 | Landis | 333/238 |
| 4,737,236 A | 4/1988 | Perko et al. | |
| 4,776,087 A | 10/1988 | Cronin et al. | 29/828 |
| 4,816,618 A | 3/1989 | Bongianni | 174/102 |
| 5,052,105 A | 10/1991 | Mische et al. | 29/883 |
| 5,151,770 A | 9/1992 | Inoue | 357/53 |
| 5,268,326 A | 12/1993 | Lesk et al. | 437/62 |
| 5,321,211 A | 6/1994 | Haslam et al. | 174/262 |
| 5,323,533 A | 6/1994 | Val | 29/840 |
| 5,421,083 A | 6/1995 | Suppelsa et al. | 29/852 |
| 5,479,053 A | 12/1995 | Oda | 257/750 |
| 5,517,747 A | 5/1996 | Pierro et al. | 29/600 |
| 5,535,626 A | 7/1996 | Bullis et al. | |
| 5,592,023 A | 1/1997 | Oda | 257/750 |
| 5,596,171 A | 1/1997 | Harris et al. | |
| 5,608,263 A | 3/1997 | Drayton et al. | 257/728 |
| 5,622,898 A | 4/1997 | Zechman | 438/127 |
| 5,639,325 A | 6/1997 | Stevens et al. | |
| 5,656,830 A | 8/1997 | Zechman | 257/784 |
| 5,665,649 A | 9/1997 | Harris et al. | |
| 5,696,466 A | 12/1997 | Li | |
| 5,757,252 A | 5/1998 | Cho et al. | 333/246 |
| 5,824,568 A | 10/1998 | Zechman | 438/112 |
| 5,914,508 A | 6/1999 | Varmazis et al. | |
| 5,930,665 A | 7/1999 | Cho et al. | 438/612 |
| 6,014,064 A | 1/2000 | Boles et al. | |
| 2003/0050028 A1 * | 3/2003 | Pasternak | 455/183.2 |

FOREIGN PATENT DOCUMENTS

JP 59-91717 * 5/1984 ............. H01P/1/00

* cited by examiner

Primary Examiner—Jasmine Clark
(74) Attorney, Agent, or Firm—Timothy W. Lohse; Gray Cary Ware & Freidenrich (57) ABSTRACT

A sculpted groundplane is provided so that monolithic dielectric structures are effectively shielded from their immediate surroundings through the implementation of transversely elongated "vias" which form continuous walls that effectively enclose the circuit elements. Further, these walls incorporate a ground plane within this same substrate, which allows for the realization of such structures on a single substrate for microstrip devices, and for realization of stripline structures utilizing only two substrates.

7 Claims, 9 Drawing Sheets

MICRO CIRCUITS WITH A SCULPTED GROUND PLANE

FIELD OF THE INVENTION

This invention relates to micromachined circuits, and more particularly to microwave frequency shielded circuit elements utilizing a low-loss dielectric.

BACKGROUND OF THE INVENTION

There are several techniques for implementing filters and resonators based on microelectronics fabrication techniques. The underlying principle of those filters is a dielectric membrane suspended over a substrate, such as a silicon wafer, with a printed circuit of the filter elements lying on top of the membrane. To facilitate the air gap underneath the membrane, the wafer is etched from the back until the membrane is reached. Filter structures usually require shielding for blocking interference and radiation losses and to some degree for protection from environmental hazards. Previously, microstrip and stripline air-dielectric structures have been micromachined using multiple substrates for the resonant elements and for the ground planes necessary to realize these structures. Typically, microstrip implementations of these devices are formed from two wafers wherein one wafer has a membrane containing resonant circuit elements, and possibly some vias or feedthroughs and the other wafer has a ground plane. The ground plane wafer is then electrically connected to the membrane wafer through vias. Stripline implementations have a third wafer to provide an upper ground plane.

The aforementioned vias or feedthroughs provide electrical connection from one plane of a wafer, to its opposing plane. In one implementation, the ground can be passed from the front surface to the back surface of the wafer for the purpose of providing microwave shielding. In this implementation, several vias of this sort are placed in sufficient proximity to one another to minimize the leakage of microwave energy through the regions between these vias. This minimization of leakage occurs because the "waveguide" which would allow energy to couple out, or leak, is of sufficiently small cross-section that the "waveguide" cut-off is below the frequency of interest for the circuit elements enclosed. Note that the vias only minimize this leakage and they do not eliminate it. Only a continuous "wall" of conductor or a very long "cut-off waveguide" could eliminate this leakage. Thus, multiple ground vias surrounding circuit elements are a compromise brought about by the exigencies of the current fabrication approach limitations.

Some implementations of shielded structures employ multiple layers of wafer. As an example, U.S. Pat. No. 5,608,263 by R. F. Draighton and L. P. B. Katehi discloses a multi-wafer circuit providing at least partial shielding based on metallized semiconductor wafers. It is desirable to create a continuous wall of conductor to improve shielding, thus minimize the energy leakage. It is also desirable to reduce the number of wafers needed to implement Q-efficient microwave structures. Thus, it is desirable to provide a microcircuit with a sculpted ground plane and it is to this end that the present invention is directed.

SUMMARY OF THE INVENTION

In accordance with this invention, monolithic dielectric structures are effectively shielded from their immediate surroundings through the implementation of transversely elongated "vias" which form continuous walls that effectively enclose the circuit elements. Further, these walls incorporate a ground plane within this same substrate, which allows for the realization of such structures on a single substrate for microstrip devices, and for realization of stripline structures utilizing only two substrates. This is accomplished without need for attachment to an additional metallized substrate as has been suggested previously. This aspect of the instant invention is called "Sculpted Ground-plane," or SGP.

A filter structure consists of a metallized printed circuit on a membrane, wherein the membrane is suspended over a cavity and a sculpted metal ground plane. The cavity is either filled with a dielectric, which can be the original substrate or can be a filled-in dielectric material, or the cavity is not filled which leaves the membrane suspended over air and the SGP. An alternate structure consists of a metallized printed circuit on a dielectric layer that fills a cavity in the substrate, wherein the cavity lays above a SGP. The edges of the SGP are exposed at the topside, providing continuous ground connection between the SGP and the topside metallization.

In accordance with the invention, a process is available for producing a filter structure with a sculpted ground plane. The process starts with a flat substrate material, such as a silicon wafer, which is selectively etched from the bottom side to create a recessed plane. A dielectric membrane is deposited on top and then the wafer is further etched selectively from the back until via sections form underneath the membrane. The backside is then metallized and the membrane is selectively etched. A metallization layer following the filter and side ground planes is deposited on top using plating and lithography processes, wherein some of the metal creates a continuous bond with the back side metal, thus acting as elongated via holes.

The above process may include additional steps for improved-high-frequency performance. One additional set of process steps eliminates the substrate material locked between the membrane and the SGP. After completing the previous process, holes are etched onto the membrane and the substrate underneath the membrane is etched out, leaving an air-suspended membrane. Another alternative set of process steps leaves the membrane with a dielectric layer underneath. In this alternative set of process steps, a wafer is selectively etched from the top to leave a gap at the depth of the recessed plane and elongated vias. The wafer is then filled with the dielectric material and the wafer top is flattened until the metal vias are exposed. The wafer top is then selectively metallized with the filter and top ground plane pattern. More process variations and the details of the above structures and processes are discussed in the description below.

DETAILED DESCRIPTION OF A PREFERRED EMBODIMENT

The invention is particularly applicable to a microwave frequency filter and it is in this context that the invention will be described. It will be appreciated, however, that the microcircuit with sculpted ground plane in accordance with the invention has greater utility, such as to other microwave frequency circuits, in the range of 1 GHz to 100 GHz where shielding and impedance match are desired and any other high frequency circuits predominantly above 10 MHz, wherein the shielding effect alone is beneficial.

Figure 1:
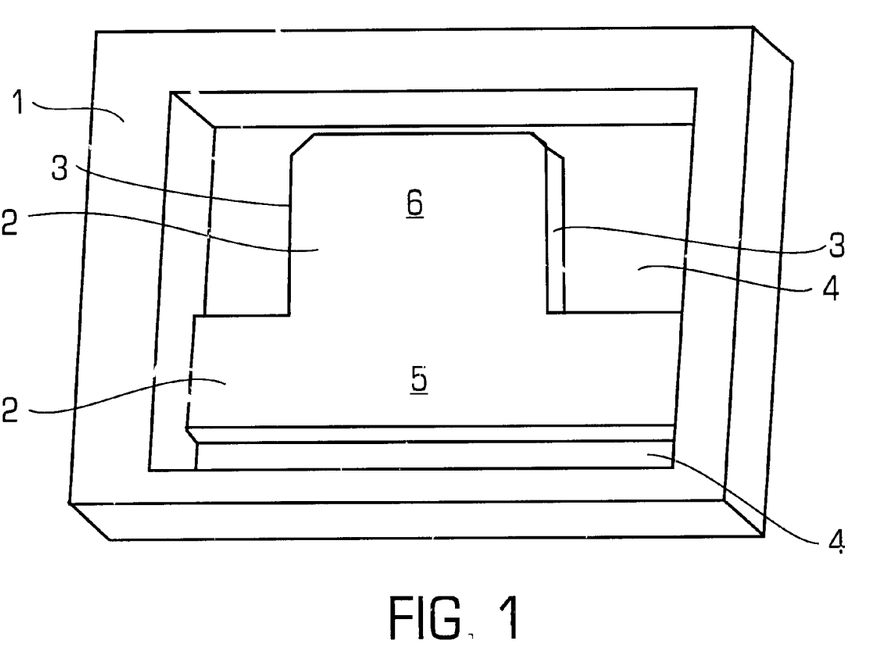
FIG. 1 is a backside view of a sculpted ground plane (SGP) in accordance with the invention.

FIG. 1 shows the backside view of an example of a sculpted ground plane (SGP) in accordance with the invention. A sculpted ground plane in accordance with the invention performs both grounding and shielding functions for a microwave or other high frequency circuit. The entire area in FIG. 1 is metallized. The backside of a substrate 1, such as a silicon wafer, is the highest surface in this upside-down view. This backside provides mechanical support for the filter structure. The substrate is etched to form a lower ground plane 2 at the level desired for a particular filter suspension height. The lower ground plane side walls 3 connect the lower ground plane 2 to the continuous via plane 4 which is located at, or is in close proximity to, the substrate front plane. The metallization of the SGP is typically accomplished by plating, using gold or copper.

Figure 2:
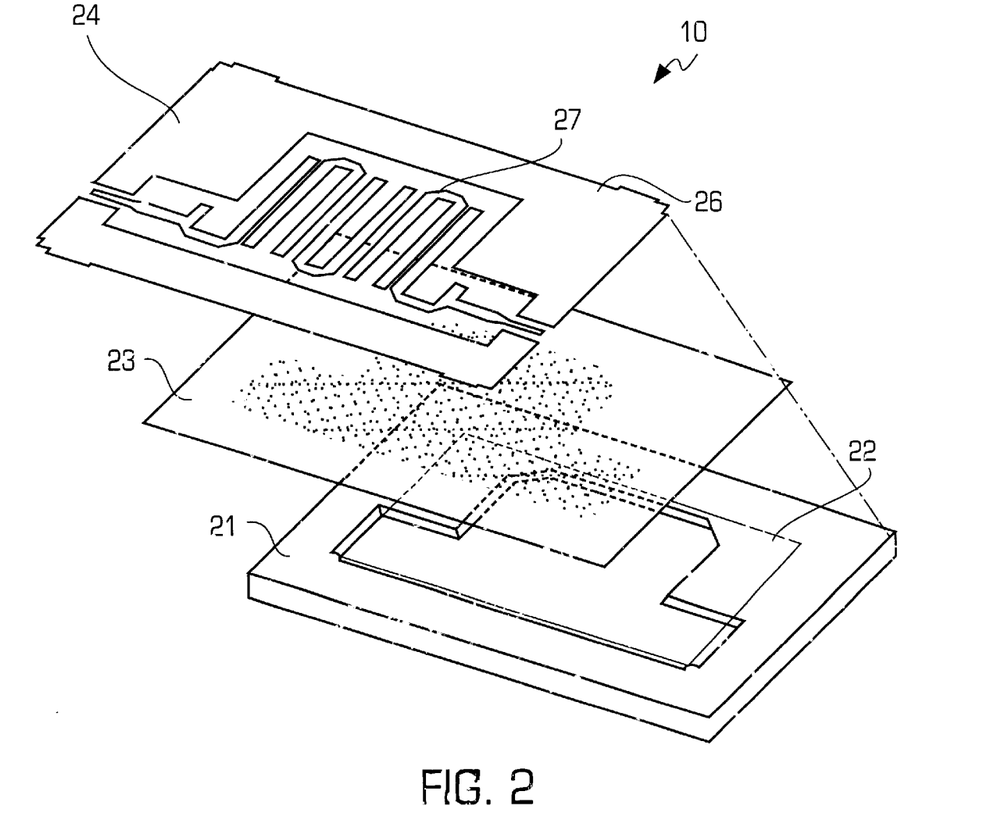
FIG. 2 shows the layers of a suspended membrane filter with a sculpted ground plane without the lid.

FIG. 2 shows an exploded view of a bottom substrate filter 10 with an SGP in accordance with the invention. A sculpted wafer 21 includes a recessed back plane 22 to form an air gap underneath the filter elements. A membrane 23 is attached to the substrate and is suspended over the air gap. A preferred membrane material is low stress plasma deposited silicon nitride, which is a widely available process in the semiconductor industry. In a preferred embodiment, the membrane 23 is punctured with holes to facilitate etching of the wafer material in the desired gap area. A metallization layer 24, which is formed on top of the membrane layer, includes a top shield portion 26 and a filter pattern portion 27. Filter patterns, such as hairpin, are well understood in the art. Simulation programs, such as HFSS, are commercially available to perform such simulation so that the exact filter geometry can be validated and the need for prototype iterations is essentially eliminated. In accordance with the invention, the metal layer 24 is forming a direct contact with the substrate 21 at some sites thus creating the shield of a SGP. A plan view of these sites 67 is discussed later in conjunction with FIG. 7.

The main benefit of a ground plane surrounding the filter element 27 is the control of distances between the filter elements and the surrounding ground planes, which is accomplished by the monolithic structure. Such controlled distance ensures precise impedance control and thus the implemented filter closely follows the intended design. Although a lid is also added, which is not monolithic, the lid height can be significantly higher than the depth of the plane under the filter element, thus the sculptured back plane would dominate the precision of setting a characteristic impedance, or the lid can be made at a similar height at the sculpted back plane and the lid effect on the filter can then be included in the filter design. The lid bonding to the main substrate can be performed accurately enough that the variance in bond height has a negligible effect on the filter's performance. A side benefit of this sculpted ground plane is the decoupling of filter suspension height from the wafer thickness. A small, low height can be accomplished without compromising the strength of the wafer foundation. Yet another benefit is the shielding effect of these metal layers. As the filter is almost completely electrically shielded, it is highly isolated from interference and cross talk.

Figure 3:
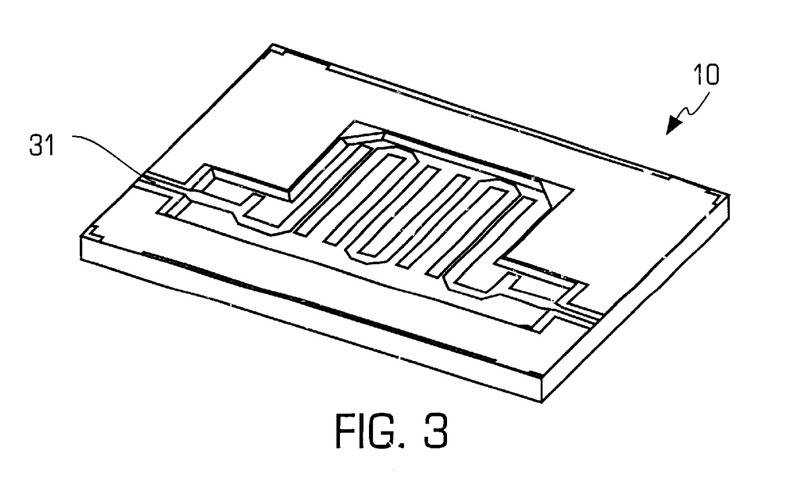
FIG. 3 shows the assembled filter of FIG. 2 without the lid.

FIG. 3 is an assembled view of the filter 10 of FIG. 2. The filter interface lead 31 is routed over the substrate to facilitate wire bonding to an external circuit. Other interface options exist; such as conductive via holes to the bottom plane of the substrate, or leaving a lead suspended on the membrane and placing the entire structure inside a waveguide, thus the suspended lead becomes a radiating probe onto the waveguide, forming a waveguide transition.

Figure 4:
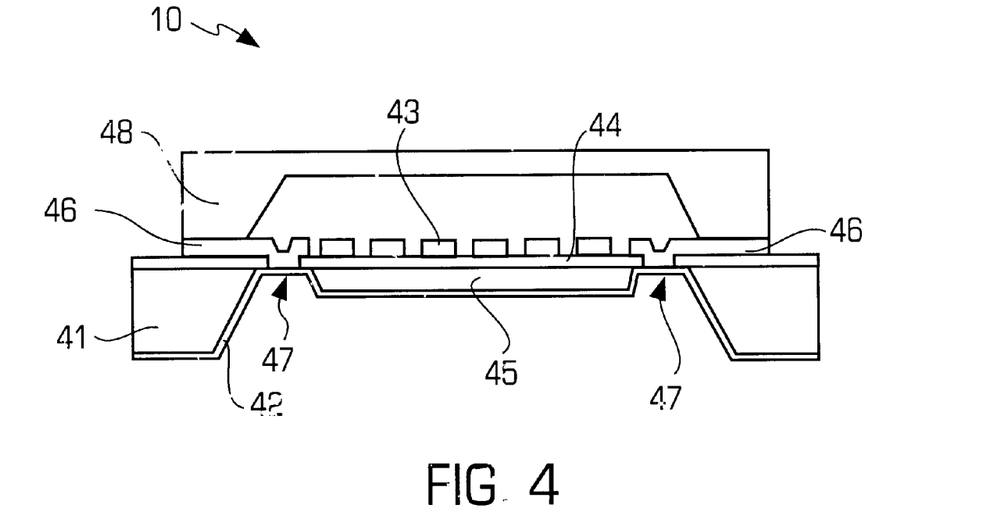
FIG. 4 is a cross section of a membrane filter with an SGP in accordance with the invention.

FIG. 4 is a cross section of a fully assembled filter 10, taken along the dotted line 6 of FIG. 1. A substrate 41, which is made of a typical semiconductor material, is back-sculpted and metallized with a metal layer 42. The filter elements 43 are mounted over a membrane 44, which is optional, because in this embodiment, the membrane is mounted over solid filling 45, thus the elements 43 can be deposited directly over the filler 45. The choice of using a membrane depends on the ability to adhere the particular metal directly to the filler material. A top layer shield 46 forms an elongated via connection 47 with the bottom metal layer 42. The filler 45 and substrate 41 material are the same, if possible, so that the filler 45 can be made as part of the typical semiconductor manufacturing process. This is especially preferred if the substrate material, such as aluminum nitrate (AlN) or high resistivity silicon, has high performance characteristics in microwave frequency ranges. In other instances, the substrate performance is insufficient for the filter performance so a different filler material is chosen. Examples of filler materials are SU8 (which is subsequently removed to leave air) or Teflon. The filter 10 is enclosed on top by a cap 48, which can be produced as a sculpted wafer. At least one side of the cap is metallized, but usually, the entire cap surface will be metallized. The air gap formed by the cap over the filter elements is taken into account when filter design is performed, as the cap forms a second ground plane in addition to the bottom shield 42. A typical depth of an air gap is between 100 microns to one mm.

Figure 5:
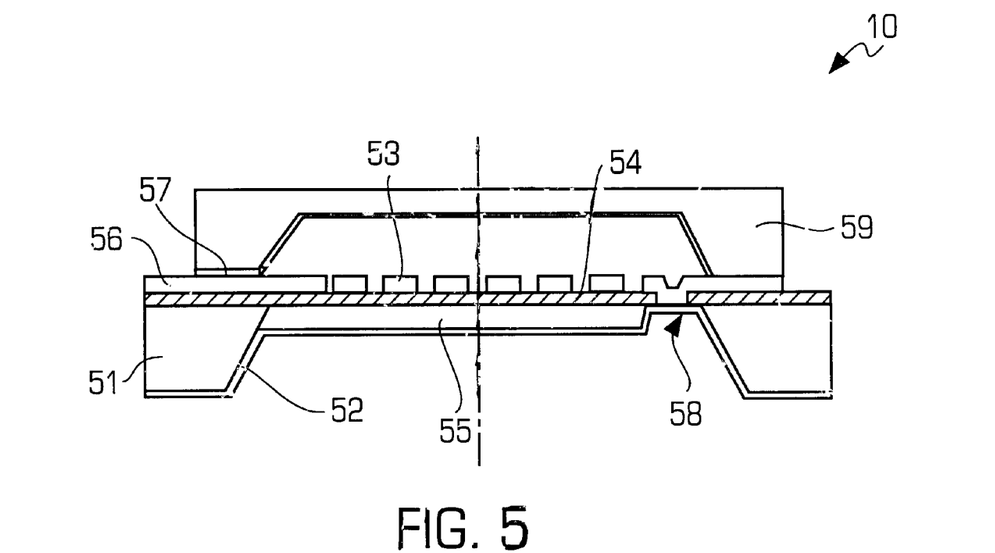
FIG. 5 is a cross section of an air-suspended membrane filter with an SGP.

FIG. 5 shows a cross section of a filter 10 with an air-suspended membrane in accordance with the invention. The left half-side is a cross section along dotted line 5 of FIG. 1, while the right half is along dotted line 6. Similar to FIG. 4, there is a substrate 51, a back shield metal layer 52, filter elements 53 and a membrane 54. The membrane is suspended over an air gap 55, and an elongated shielding via 58 is formed between a top cap shield 59 and the bottom shield layer 52. On the left half, a filter lead 56, is formed over a membrane and it exits the cap 59 via a mouse hole 57.

Figure 6:
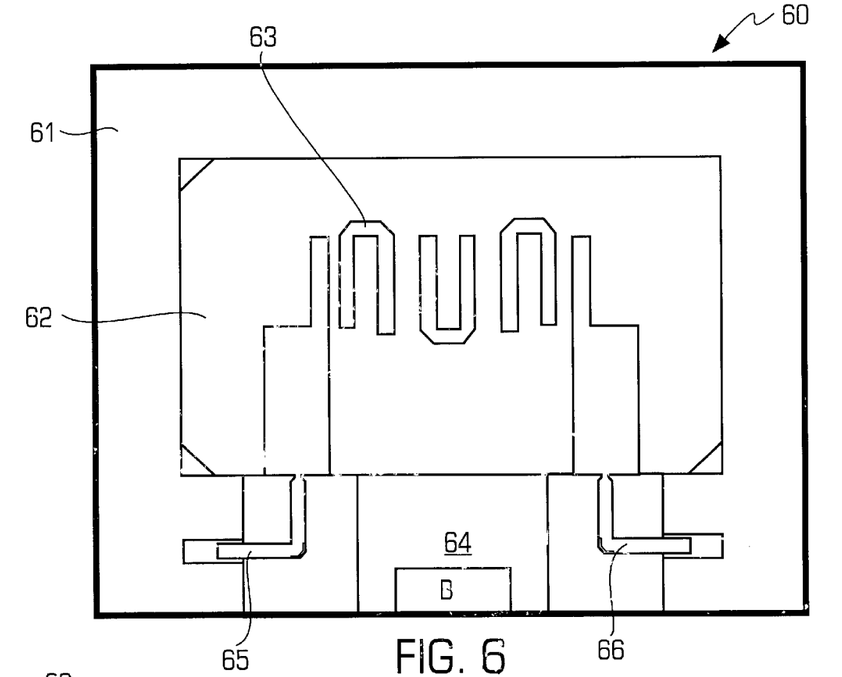
FIG. 6 is a top view of the metallization and membrane layers of a hairpin filter implemented over an SGP in accordance with the invention.

FIG. 6 shows a top view an actual filter 10, without the lid, manufactured with SGP in accordance with the invention. This filter has the same input/output topology of the filter shown in FIGS. 1, 2 and 3, except that the I/O pins in FIG. 6 are in the same side. Both approaches are useful, and the choice of geometry is guided by outside circuit preferences as well as the ease of arranging and orienting the filters on a wafer. Most of the filter is surrounded by a ground plane 61. A middle area has a suspended membrane 62 with metallic filter elements 63 formed on the membrane 62. Another section of a ground plane 64 is placed between a first filter lead 65 and a second filter lead 66 so that the ground plane is discontinued only near the leads as shown so that a high level of shielding is obtained. The extent of the ground plane via is marked by a dotted line 67 on the filter in FIG. 7. Once a lid is placed on the filter, only areas near the leads have a discontinuous ground plane.

Figure 7:
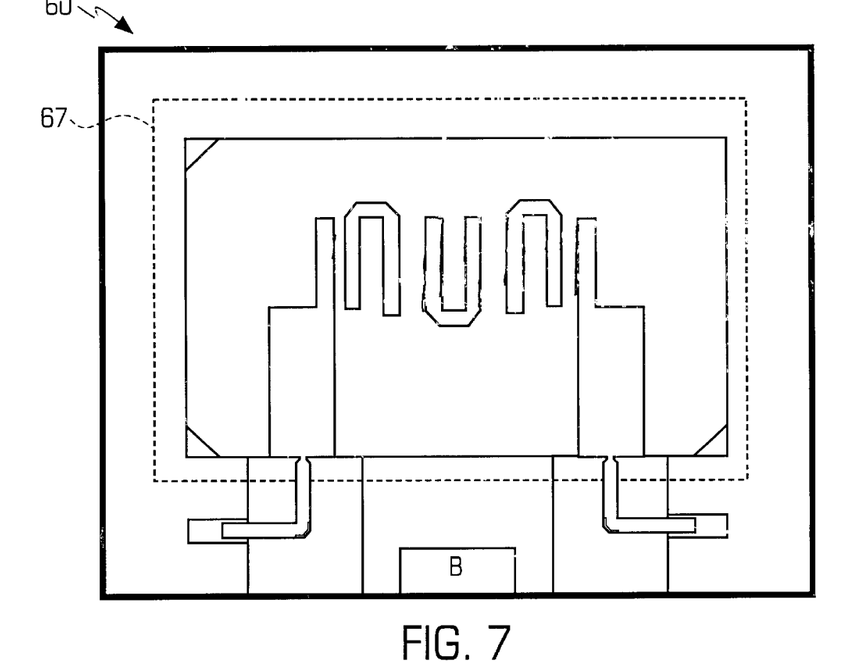
FIG. 7 shows, in a plan view, the extent of the elongated ground vias in FIG. 6.
Figure 7B:
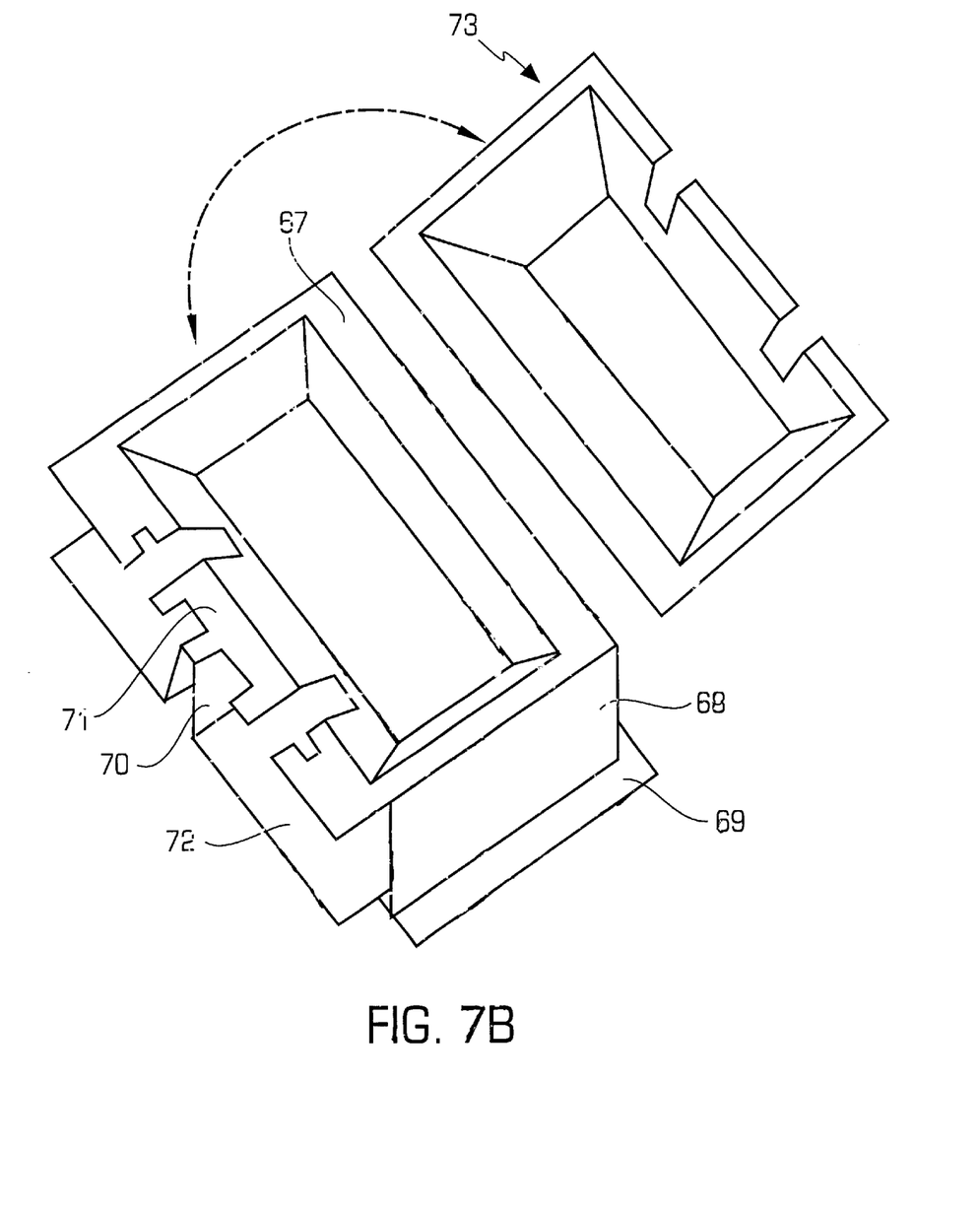
FIG. 7B illustrates the metallization-only of the bottom wafer, which creates part of a sculpted ground plane, and the matching lid metallization.

The structure of the ground plane in the filter of FIGS. 6 and 7 is further illustrated in FIG. 7b. This drawing is not drawn to exact proportions of the original filter shown of FIGS. 6 and 7. The wafer material, filter conductors and the membrane are not drawn in order to better expose the ground plane surfaces. The top surface 67 is part of the ground via connection, continued by outside walls 68 to the bottom side of the wafer 69. A grounding post 70 is also illustrated to show the geometrical feasibility to add ground vias between the top-exposed plane 71 and a bottom exposed plane 72. Finally, the shied-related metallization 73 of a matching lid is also illustrated. The lid surface is simpler than the main SGP because one-side wafer etching is sufficient, or even a metal-only lid can be used.

Figure 8:
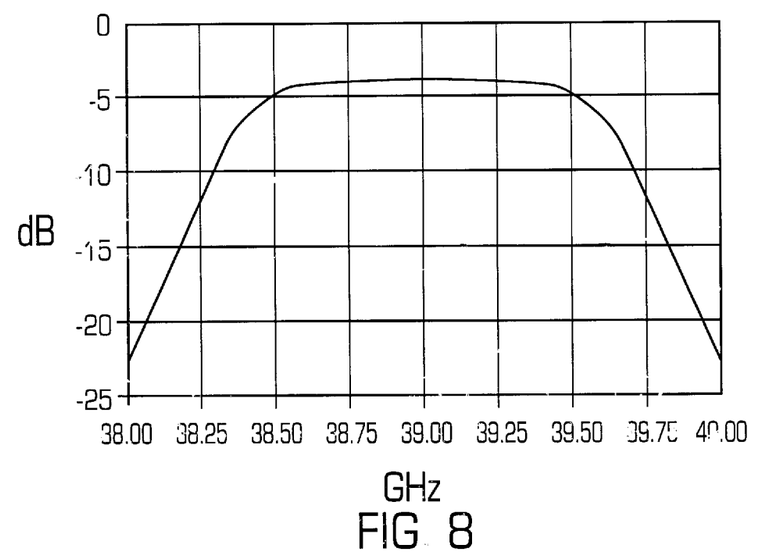
FIG. 8 illustrates the frequency response of the filter in FIG. 6.

The response of the filter with the SGP of FIGS. 6 and 7 is shown in FIG. 8. The horizontal axis shows frequency in GHz. The vertical axis shows the transmission gain in dB. The response agrees with simulation, and although there is a band pass loss of about 3.5 dB, this loss is far better than filters printed on dielectric material. Typically, a filter deposited on a dielectric material would suffer dielectric losses and the concentration of currents in the resulting smaller metal traces needed to maintain a given impedance would result in higher conduction losses. Furthermore, this response is not adversely affected by the filter proximity to other system elements because of the shielding protection.

Figure 9:
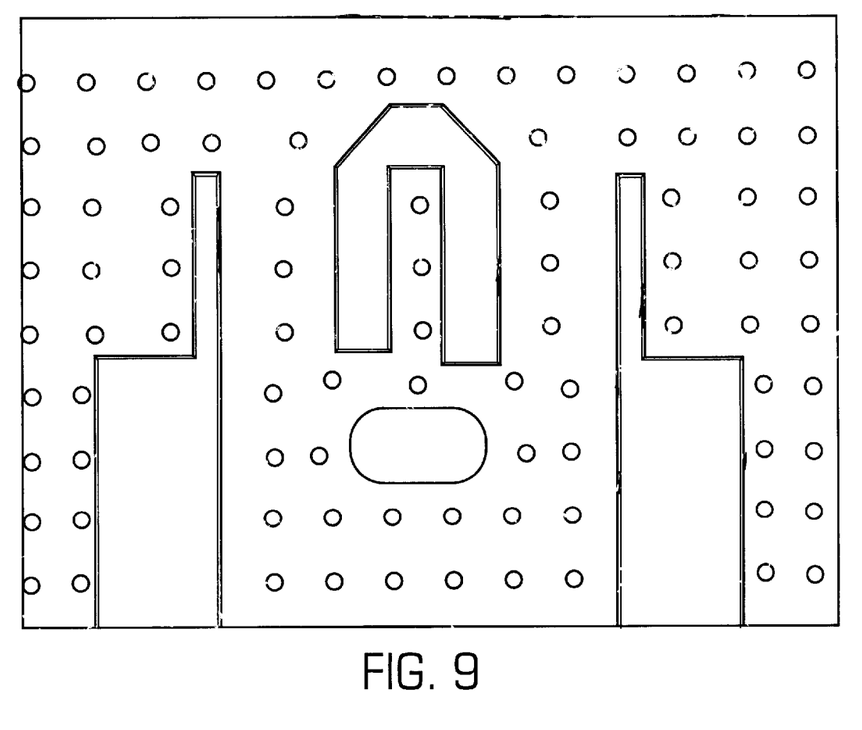
FIG. 9 shows a hole-pattern in a released membrane, which facilitated etching underneath.

FIG. 9 shows an example of the hole-pattern in a membrane that is used for transfer of etching solution to the silicon underneath the membrane and for removal of the etching remnants. Because of membrane stress, the holes have rounded edges and relatively small diameters. A typical diameter is 50 microns.

Figure 10:
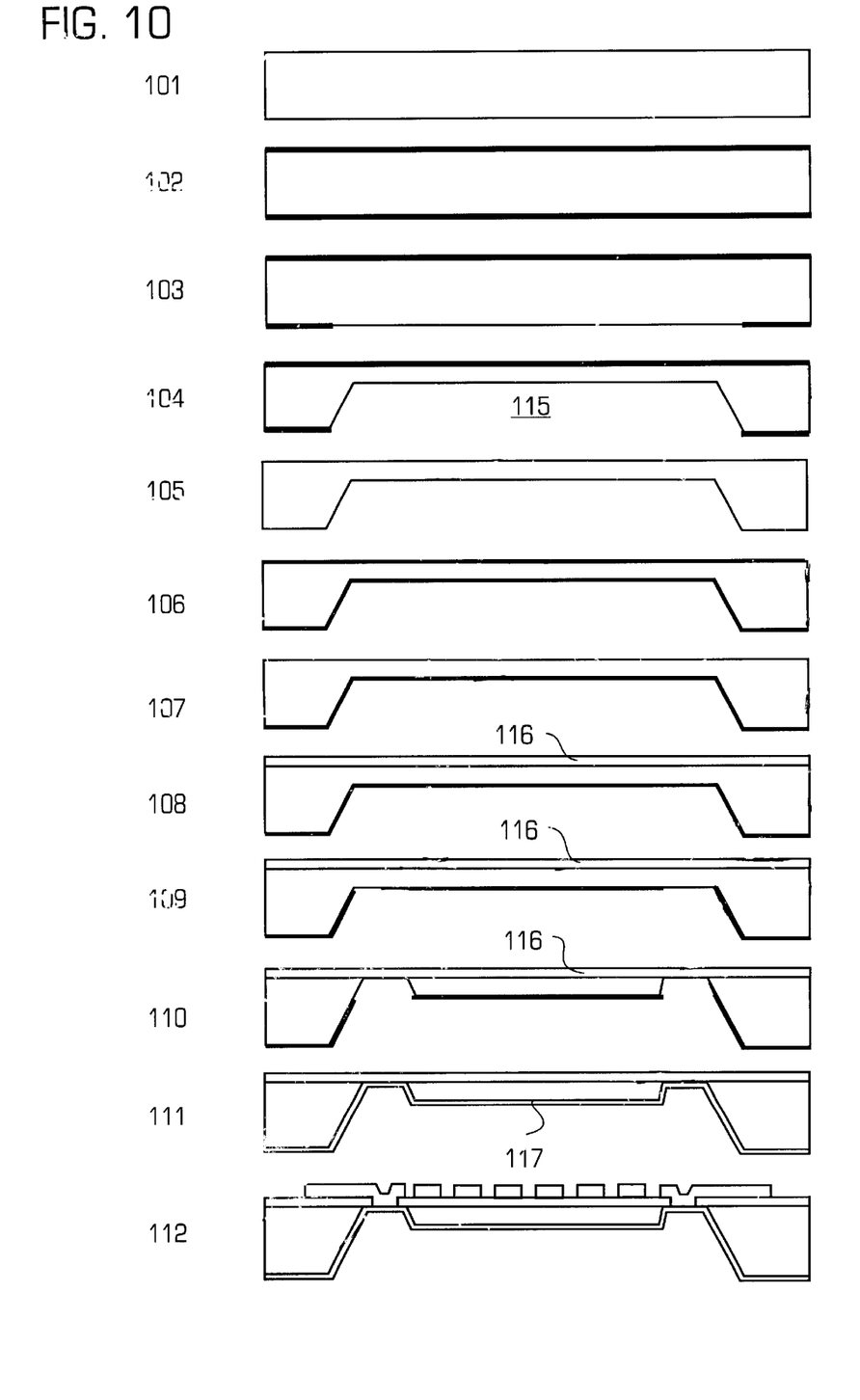
FIG. 10 shows the process steps in accordance with the invention for producing a suspended membrane filter with SGP.
Figure 11:
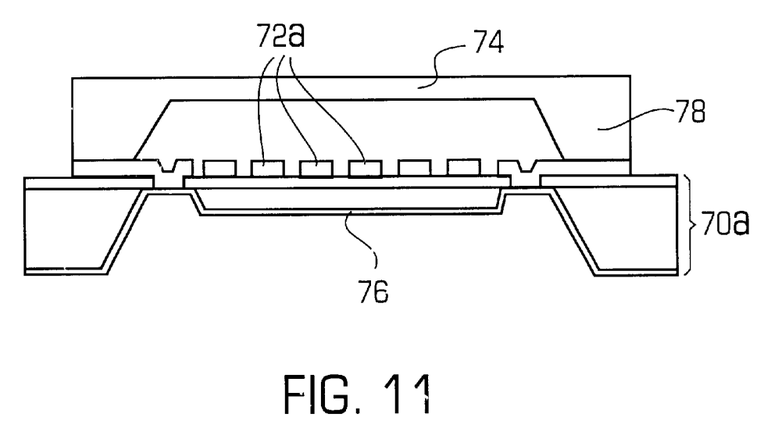
FIG. 11 shows the resulting suspended membrane filter with SGP and a top cap.

FIG. 10 shows an example of a method in accordance with the invention for manufacturing a suspended membrane filter with sculpted ground plane wherein a cross section of the silicon wafers at progressing manufacturing process steps are shown. FIG. 11 illustrates a bottom wafer 70a with filter elements 72a under a lid wafer 74, also referred below as a "cap". When these two wafers are bonded to each other, it is clear that the metallized surfaces 76 and 78 will completely surround the filter structure and filter elements 72a to provide the desired shielding for high frequency circuits. The highlights of a process to create a filter wafer with SGP is as follows. First the wafer is etched from the backside to the level of the recessed ground plane. Then, a dielectric layer is deposited on the topside forming a membrane. The wafer is further etched in the backside to form the via-sections up to the membrane. The wafer is metallized on the backside, the membrane is selectively etched from the topside and finally a patterned metal layer is deposited on top, wherein sections of this metal layer make contact with the via-sections of backside metal.

FIG. 10 illustrates a more detailed description of this process. Each process step is described in general terms, because the performance of each step is based on well-known techniques in the wafer processing art. Also, the choices of mask materials and etchants are well known in the art. For example, many techniques are described in the book "Fundamentals of Mircofabrication" by Marc Madou. These include lithography, pattern transfer with dry etching techniques, pattern transfer with additive techniques, and wet bulk micromachining. The process starts with a well known double-side polished wafer 101. The wafer is then oxidized on both sides in step 102. The bottom side is then patterned with a cavity mask and the oxide layer is etched in step 103. The bottom wafer is now etched in the exposed area to from a partial cavity 115 in step 104. The remaining oxide is stripped in step 105. In step 106, the whole wafer is re-oxidized, and the top oxide layer is stripped in step 107. A dielectric layer 116 for the membrane layer is deposited in step 108. Then, the remaining backside is patterned with the via-sections and the oxide in those sections is etched in step 109. Then, the exposed wafer sections are etched all the way to the membrane in step 110 as shown. The remaining oxide is removed and the entire backside is metallized with a metal layer 117 in step 111. The metallization is preferably accomplished by first depositing a thin metal layer and then by plating this metal to form a thick layer, on the order of 5 microns. Next the membrane is selectively etched in the via-section and a plating base metal is selectively deposited and then the metal is plated in step 112 to form the vias and the filter elements. The result with cap attached is shown in FIG. 11.

Figure 12:
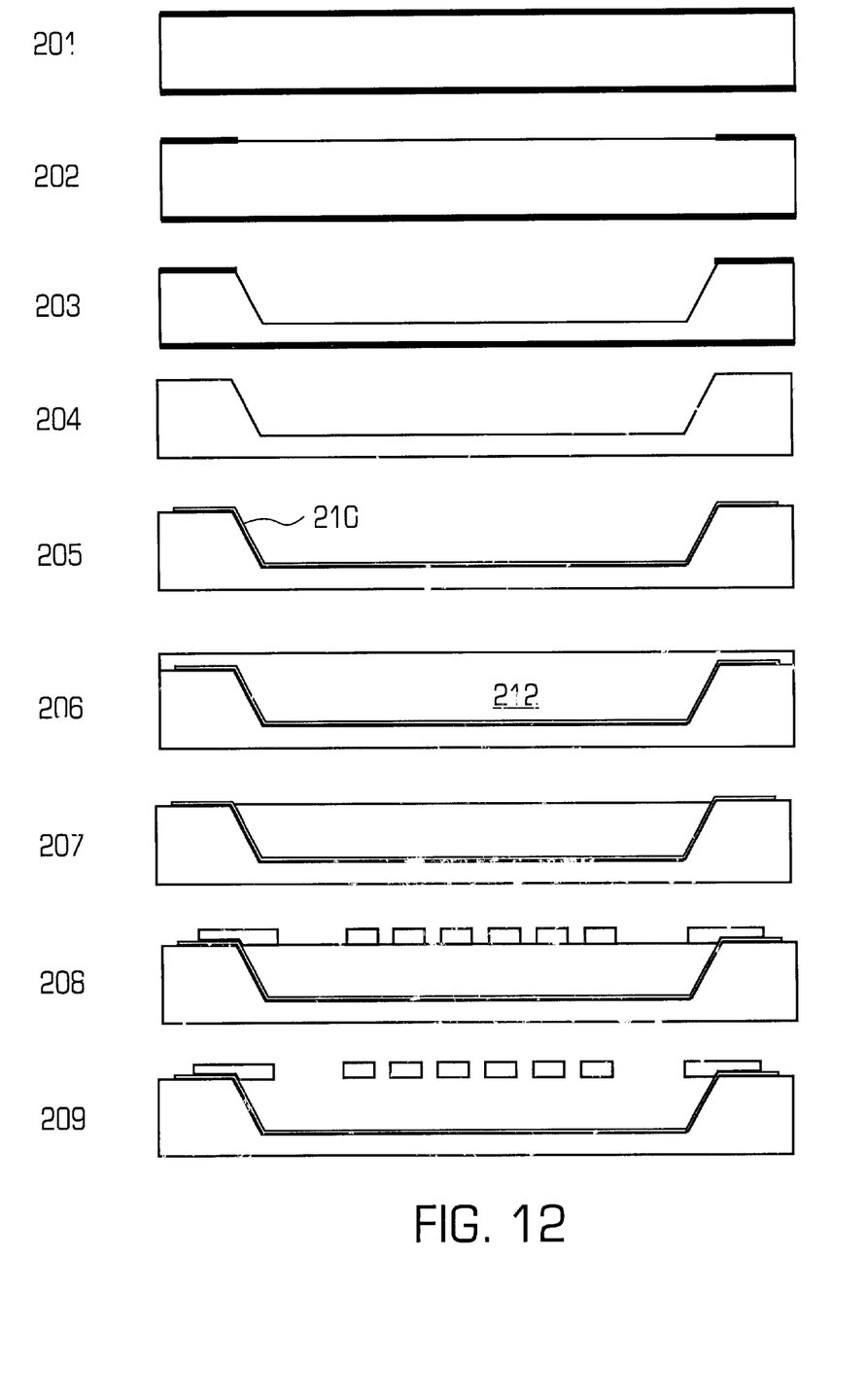
FIG. 12 shows the process steps of a dielectric-filled filter with SGP, created primarily from the frontside of the wafer.
Figure 13:
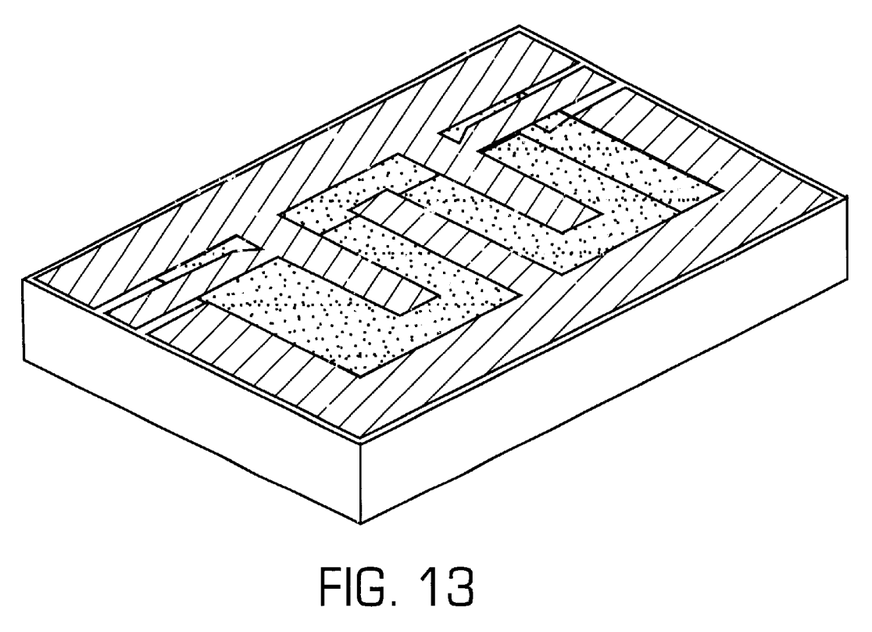
FIG. 13 shows an isometric view of a filter created with a frontside process.

The process steps so far have produced a filter whose membrane is attached to the wafer material, as seen in step 112. If a suspended membrane is desired, the etched membrane includes holes (as shown in FIG. 9) above the recessed ground plane and the wafer is etched through the holes. An alternative preferred process enables a membrane filled underneath with a desired dielectric material other than the wafer. The process is similar to the detailed process discussed above and is illustrated in FIG. 12. The process starts with a double side polished wafer which is oxidized in step 201. Then, the oxide is patterned on one side to mask a cavity etch in step 202. The anisotropic cavity etch is carried out in step 203, and the oxide is stripped in step 204. Then, the wafer is metallized and a metal layer 210 is patterned in step 205. The resulting metallized cavities are filled with a dielectric material 212 in step 206, which is planarized in step 207 to selectively expose the original wafer surface and the deposited metal on that surface. The dielectric can remain in place (see step 208), or be removed (see step 209). FIG. 13 depicts an isometric view of a filter constructed using the above described method. The filter is of the well-known interdigitated variety.

The SGP as disclosed in this invention has thus effectively reduced the number of layers and/or wafers that must be assembled in order to realize a functional device. The added benefits of the SGP in accordance with the invention include a more compact arrangement for establishing the shielding between adjacent devices, and thus a higher degree of integration of microwave circuit elements.

The cap is prepared in a similar process. While the cap can be wholly metal-made, a preferred process starts with a similar wafer material as the filter base. The cap wafer starts with a double polished wafer such as the wafer 101 in FIG. 10; the backside is etched like step 107 and then metallized like step 111. The cap can be attached to the filter by bonding the metal layers together (e.g. thermocompression bonding), with soldering material, or conductive epoxy. The cap, as described above, may form a second ground plane.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A shielded micromachined high frequency structure, comprising:
    a micromachined substrate;
    a metal layer formed on the top surface of said substrate, the metal layer forming one or more conducting elements of a high frequency circuit and a conductive groundplane that essentially surrounds said high frequency circuit elements;
    a sculpted groundplane attached underneath said circuit elements; and
    a lid structure with a conductive metal layer at the bottom surface conductively attached to top surface groundplane, wherein said conductive groundplane, said sculpted groundplane and said lid metal layer provide essentially a complete shielded enclosure to said circuit elements.

2. The structure of claim 1 further comprising a dielectric membrane located between the top surface of said substrate and said metal layer.

3. The structure of claim 2, wherein a portion of said dielectric membrane is suspended over an air gap, wherein the air gap is above said sculpted groundplane.

4. The structure of claim 2, wherein the dielectric membrane is suspended over the sculpted groundplane and a space between said dielectric membrane and said sculpted groundplane is filled with a dielectric material.

5. A process for manufacturing a wafer structure with a topside having a microwave circuit and said circuit being mounted above a sculpted ground plane formed on the backside of the wafer, comprising:
    selectively etching portions of a backside of a wafer to form a recessed ground plane cavity;
    depositing a dielectric layer on the topside of the wafer to form a membrane layer;
    selective etching portions of the backside of the wafer through to the membrane layer to form one or more via sections;
    forming a metal layer on the backside of the wafer to provide a sculpted groundplane;
    selectively forming a metal layer on the topside of the wafer to create electrical contacts; and
    forming a patterned metal layer on top of the metal layer, wherein sections of this patterned metal layer make contact with the via-sections of backside metal to form a groundplane.

6. The process of claim 5 further comprising etching the wafer material held between said membrane and said sculpted groundplane.

7. The process of claim 6 in which said etching is performed through holes previously made in said membrane.

* * * * *